United States Patent
Shi et al.

(10) Patent No.: US 9,245,933 B2
(45) Date of Patent: Jan. 26, 2016

(54) ELECTROLUMINESCENT (EL) DEVICE AND DISPLAY DEVICE

(71) Applicant: BOE TECHNOLOGY GROUP CO., LTD., Beijing (CN)

(72) Inventors: Shiming Shi, Beijing (CN); Kazuyoshi Nagayama, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 14/365,846

(22) PCT Filed: Nov. 15, 2013

(86) PCT No.: PCT/CN2013/087273
§ 371 (c)(1),
(2) Date: Jun. 16, 2014

(87) PCT Pub. No.: WO2015/027575
PCT Pub. Date: Mar. 5, 2015

(65) Prior Publication Data
US 2015/0102306 A1    Apr. 16, 2015

(30) Foreign Application Priority Data
Aug. 30, 2013   (CN) .......................... 2013 1 0389319

(51) Int. Cl.
*H01L 27/32* (2006.01)
*H01L 51/52* (2006.01)

(52) U.S. Cl.
CPC .......... *H01L 27/3248* (2013.01); *H01L 27/326* (2013.01); *H01L 51/5206* (2013.01);
(Continued)

(58) Field of Classification Search
CPC .............. H01L 27/322; H01L 27/3211; H01L 27/3213
See application file for complete search history.

(56) References Cited

U.S. PATENT DOCUMENTS 6,965,197 B2  11/2005  Tyan et al.
7,489,075 B2   2/2009  Lee
(Continued)

FOREIGN PATENT DOCUMENTS

CN   1498046 A   5/2004
CN   1780017 A   5/2006
(Continued)

OTHER PUBLICATIONS

International Search Report, International Preliminary Report on Patentability and Written Opinion of the International Searching Authority of PCT/CN2013/087273 in Chinese, mailed Jun. 5, 2014.
(Continued)

*Primary Examiner* — Whitney T Moore
(74) *Attorney, Agent, or Firm* — Collard & Roe, P.C.

(57) ABSTRACT

An electroluminescent (EL) device and a display device are disclosed. The OLED device comprises a base substrate; a plurality of pixel units arranged in an array are disposed on the base substrate; each pixel unit comprises sub-pixel units provided with EL structures; the EL structures each comprise a transparent anode, an emission layer (EML) and a transparent cathode disposed on the base substrate in sequence; the EL structure of each sub-pixel unit is divided into a transmissive area and a reflective area; and the reflective area of the EL structure is provided with a reflective layer. The EL device can achieve transparent display with the transmissive area of each sub-pixel unit, and meanwhile, the transmissive area for achieving transparent display can also realize normal display.

6 Claims, 2 Drawing Sheets

(52) U.S. Cl.
CPC ........ *H01L51/5218* (2013.01); *H01L 51/5237* (2013.01); *H01L 27/322* (2013.01); *H01L 27/3211* (2013.01); *H01L 51/5234* (2013.01); *H01L 51/5271* (2013.01)

(56) References Cited

U.S. PATENT DOCUMENTS

| | | | |
|---|---|---|---|
| 8,124,962 B2 | 2/2012 | Kang | |
| 2005/0012455 A1* | 1/2005 | Lee et al. | 313/506 |
| 2011/0273409 A1 | 11/2011 | Lee et al. | |
| 2013/0113843 A1 | 5/2013 | Yamazaki | |
| 2013/0214301 A1* | 8/2013 | Yamada et al. | 257/88 |
| 2014/0183471 A1* | 7/2014 | Heo | H01L 27/322 257/40 |

FOREIGN PATENT DOCUMENTS

| | | |
|---|---|---|
| CN | 1802051 A | 7/2006 |
| CN | 101345292 A | 1/2009 |
| CN | 103094307 A | 5/2013 |
| CN | 203398117 U | 1/2014 |
| KR | 10-2006-0107151 A | 10/2006 |
| KR | 10-2007-0034769 A | 3/2007 |
| KR | 10-0714010 B1 | 4/2007 |
| KR | 10-0731753 B1 | 6/2007 |

OTHER PUBLICATIONS

Chinese Office Action of Chinese Application No. 201310389319.3, mailed Aug. 6, 2015 with English translation.

* cited by examiner

ELECTROLUMINESCENT (EL) DEVICE AND DISPLAY DEVICE

CROSS REFERENCE TO RELATED APPLICATIONS

This application is the National Stage of PCT/CN2013/087273 filed on Nov. 15, 2013, which claims priority under 35 U.S.C. §119 of Chinese Application No. 201310389319.3 filed on Aug. 30, 2013, the disclosure of which is incorporated by reference.

TECHNICAL FIELD

Embodiments of the present invention relate to an electroluminescent (EL) device and a display device.

BACKGROUND

Transparent display of display devices is the technical direction having received much concern in the display field in recent years. Both thin-film transistor liquid-crystal display (TFT-LCD) device and active-matrix organic light-emitting diode (AMOLED) device can be used to realize transparent display, and the AMOLED device has better display effect and is the main research direction of transparent display technology.

At present, the transparent display of an AMOLED device is achieved with the aid of blank windows. A transparent window is disposed within each pixel unit or a plurality of pixel units of the AMOLED device; no organic light-emitting diode (OLED) is disposed in the transparent window, or an OLED is disposed in the transparent window but the OLED in the transparent window is not driven; and hence the transparent display can be achieved.

In a traditional solution of an AMOLED device for achieving transparent display, transparent window areas in the AMOLED device cannot be utilized and can only be used as transmissive areas.

SUMMARY

The present invention provides an EL device and a display device. The EL device can achieve transparent display, and transmissive areas for achieving transparent display in the EL device may also realize normal display. Therefore, the utilization rate of the transmissive areas can be improved and the display effect of the EL device can be improved.

In one aspect, the present invention provides an EL device, which comprises a base substrate; a plurality of pixel units arranged in an array are disposed on the base substrate; each pixel unit comprises sub-pixel units provided with EL structures; the EL structures each comprise a transparent anode, an emission layer (EML) and a transparent cathode disposed on the base substrate in sequence; the EL structure of each sub-pixel unit is divided into a transmissive area and a reflective area; and the reflective area of the EL structure is provided with a reflective layer.

The EL device can achieve transparent display through the transmissive area of each sub-pixel unit, and meanwhile, the transmissive area for achieving transparent display can also achieve normal display. Therefore, the utilization rate of the transmissive areas can be improved and the display effect of the EL device can be improved.

For instance, the EL device may be in a top-emission structure. For instance, the reflective layer is disposed between the transparent anode and the EML, or the reflective layer is disposed on one side of the transparent anode away from the EML.

For instance, in order to achieve the color display of the EL device, each pixel unit comprises three sub-pixel units, and EMLs of the three sub-pixel units emit red light, green light and blue light respectively.

For instance, in the EL device, light emitted by the EMLs of the plurality of sub-pixel units in each pixel unit is white; and one surface of the EML away from the reflective layer is provided with a color filter, which is opposite to the reflective area and is assembled with the base substrate to form a cell. The EL device can achieve color display through the color filters. As the transmissive areas are not shielded by the color filters, the transparent effect of the transmissive areas in the ease of transparent display is not affected.

For instance, the EL device may also be in a bottom-emission structure. For instance, the reflective layer is disposed on one side of the transparent cathode away from the EML.

For instance, in order to achieve the color display of the EL device, each pixel unit may include three sub-pixel units, and EMLs of the three sub-pixel units emit red light, green light and blue light respectively.

For instance, in the EL device, light emitted by the EMLs of the plurality of sub-pixel units in each pixel unit is white; and one surface of the EML away from the reflective layer is provided with a color filter layer opposite to the reflective area and formed on the base substrate. The EL device can achieve color display through the color filter layers with different colors in the sub-pixel units of each pixel unit.

For instance, in order to prevent water from the outside from damaging the EL device, the EL device may further comprise an EML encapsulating structure. By adoption of the EML encapsulating structure to encapsulate the EL device, the EL device is isolated from water and oxygen from the outside, and hence the damage of the water and the oxygen to the EL device can be reduced.

For instance, the EL device adopts active matrix; a thin-film transistor (TFT) may also be disposed on the base substrate; and the transparent anode is electrically connected with a source electrode of the TFT.

For instance, the TFT is an amorphous silicon (a-Si) TFT, a low-temperate polycrystalline silicon (LTPS) TFT, an oxide semiconductor TFT or an organic TFT.

In another aspect, the present invention provides a display device, which comprises the EL device provided by any of the foregoing technical solutions. As the EL device can improve the utilization rate of the transmissive areas and hence has good display effect, the display device comprising the EL device has good display effect while achieving transparent display.

BRIEF DESCRIPTION OF THE DRAWINGS

Simple description will be given below to the accompanying drawings of the embodiments to provide a more clear understanding of the technical proposals of the embodiments of the present invention. It will be obvious to those skilled in the art that the drawings described below only involve some embodiments of the present invention but are not intended to limit the present invention.

DETAILED DESCRIPTION

For more clear understanding of the objectives, technical proposals and advantages of the embodiments of the present invention, clear and complete description will be given below to the technical proposals of the embodiments of the present invention with reference to the accompanying drawings of the embodiments of the present invention. It will be obvious to those skilled in the art that the preferred embodiments are only partial embodiments of the present invention but not all the embodiments. All the other embodiments obtained by those skilled in the art without creative efforts on the basis of the embodiments of the present invention illustrated shall fall within the scope of protection of the present invention.

Figure 1:
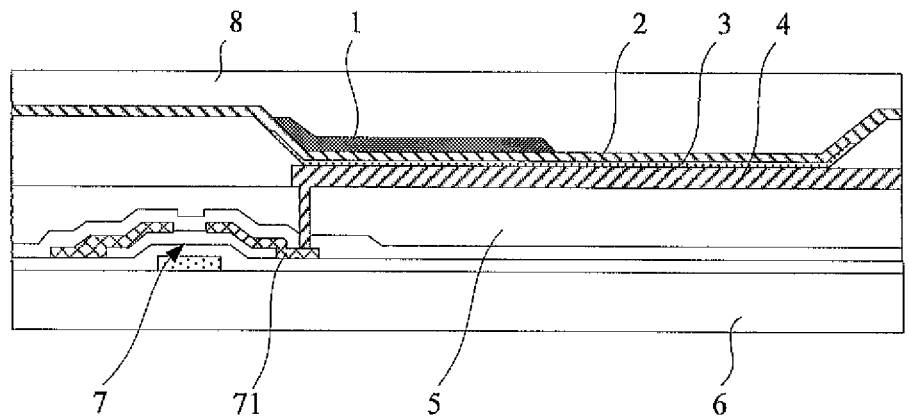
FIG. 1 is a schematic structural view of an EL device provided by an embodiment of the present invention, which is in a bottom-emission structure.
Figure 5:
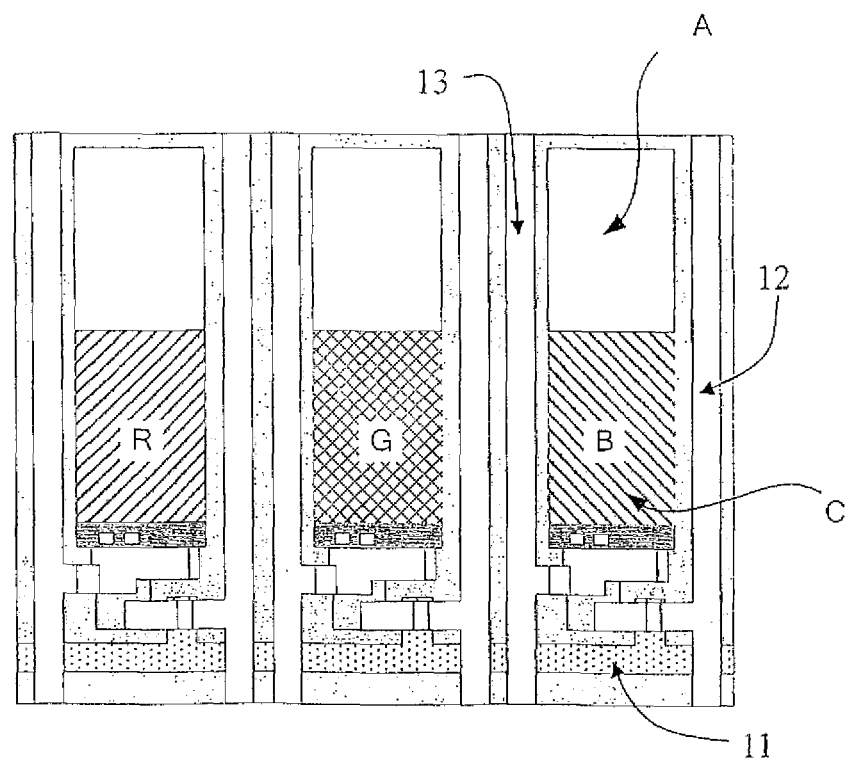
FIG. 5 is a schematic structural view of sub-pixel units in a pixel unit of the EL device provided by an embodiment of the present invention.

As illustrated in FIGS. 1 and 5, FIG. 1 is a schematic structural sectional view of an EL device provided by an embodiment of the present invention, which is in a bottom-emission structure, and FIG. 5 is a schematic structural plan view of sub-pixel units in a pixel unit of the EL device provided by the embodiment of the present invention.

As illustrated in FIG. 5, the EL device provided by the embodiment of the present invention comprises gate lines 11, data lines 12 and power lines 13. The data lines 12 and the power lines 13 are parallel to each other, disposed on both sides of the pixel units, and intercrossed with the gate lines 11.

As illustrated in FIG. 1, the EL device provided by the embodiment of the present invention comprises: a base substrate 6; a plurality of pixel units arranged in an array are disposed on the base substrate 6; each pixel unit comprises at least three sub-pixel units; and each sub-pixel unit is provided with an EL structure. The EL structure comprises a transparent anode 4, an EML 3 and a transparent cathode 2 disposed on the base substrate 6 in sequence.

As illustrated in FIG. 5, the EL structure of each sub-pixel unit is divided into a transmissive area A and a reflective area C, and the reflective area C of the EL structure is provided with a reflective layer 1.

In the plurality of sub-pixel units of each pixel unit of the EL device, the EL structure of each sub-pixel unit comprises the reflective area C and the transmissive area A, and the reflective area C is provided with the reflective layer 1. Both the transparent anode 4 and the transparent cathode 2 of the EL structure are made of transparent materials. Therefore, when the EML 3 in the EL structure emits light, a part of the EML 3, corresponding to the transmissive area A, will also emit light, and hence a corresponding part of the transmissive area A in each sub-pixel unit can also be used to realize display; and when the EML 3 in the EL structure does not emit light or emits weak light, light on the other side of the EL device can pass through the transmissive area A, and at this point, the transmissive area A can be used to achieve transparent display.

Therefore, the EL device can achieve transparent display with the transmissive area A in each sub-pixel unit, and meanwhile, the transmissive area A for achieving transparent display can also achieve normal display, and hence the utilization rate of the transmissive area A is improved and the display effect of the EL device can be improved.

The specific exemplary structure of the EL device provided by the foregoing embodiment may adopt various modes described below.

Figure 3:
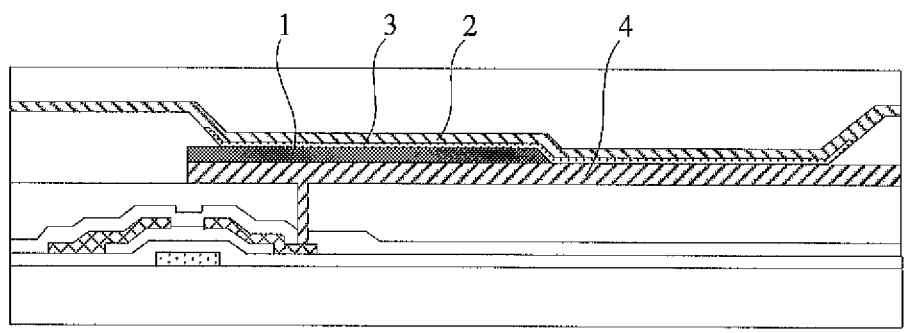
FIG. 3 is a schematic structural view of an EL device provided by an embodiment of the present invention, which is in a top-emission structure.
Figure 4:
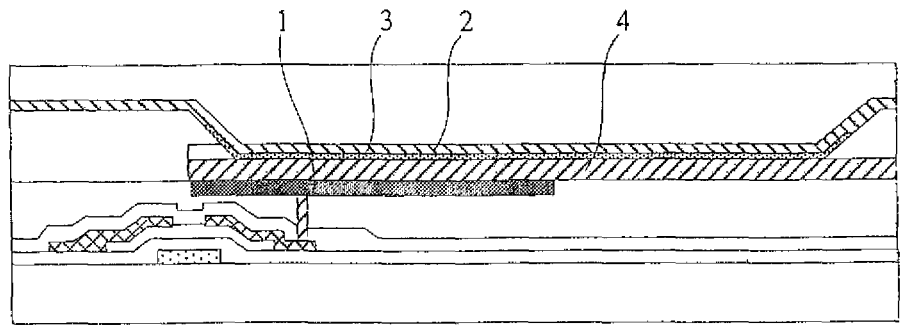
FIG. 4 is another schematic structural view of the EL device provided by an embodiment of the present invention, which is in a top-emission structure.

Mode 1: as illustrated in FIGS. 3 and 4, FIG. 3 is a schematic structural view of an EL device provided by the present invention, which is in a top-emission structure; and FIG. 4 is another schematic structural view of the EL device provided by the present invention, which is in a top-emission structure.

In a preferred embodiment, the EL device may have a top-emission structure: as shown in FIG. 3, the reflective layer 1 may be disposed between the transparent anode 4 and the EML 3; or as shown in FIG. 4, the reflective layer 1 is disposed on one side of the transparent anode 4 away from the EML 3.

In the case where the reflective layer 1 is disposed between the transparent anode 4 and the EML 3, the light emitted to the base substrate 6, when a part of the EML 3 corresponding to the reflective area C emits light, will be reflected by the reflective layer 1 to one side away from the base substrate 6, and hence the top emission can be achieved. Similarly, in the case where the reflective layer 1 is disposed on one side of the transparent anode 4 away from the EML 3, the light emitted to the base substrate 6, when a part of the EML 3 corresponding to the reflective area C emits light, will be reflected by the reflective layer 1 to one side away from the base substrate 6 after running through the transparent anode 4, and hence the top emission can be achieved.

On the basis of the mode 1, in order to achieve the color display of the EL device, in a preferred embodiment, each pixel unit comprises three sub-pixel units, for instance, RGB sub-pixel units as shown in FIG. 5, and EMLs of the three sub-pixel units emit red light, green light and blue light respectively.

Of course, each pixel unit may also include four sub-pixel units. For instance, EMLs 3 of the sub-pixel units emit red light, green light, blue light and yellow light respectively. As the light emitted by the EMLs 3 of the sub-pixel units in each pixel unit has different colors, the color display of the EL device can be achieved.

On the basis of the mode 1, in another preferred embodiment, the light emitted by the EMLs 3 of the plurality of sub-pixel units in each pixel unit of the EL device may be white; and one surface of the EML 3 away from the reflective layer 1 is provided with a color filter, which is opposite to the reflective area C and is assembled with the base substrate 6 to form a cell. The EL device can achieve color display by the color filters. Moreover, as the transmissive areas A are not shielded by the color filters, the transparent effect of the transmissive area A in the case of transparent display will not be affected.

When the light emitted by the EMLs 3 of the plurality of sub-pixel units in each pixel unit of the EL device is white, a color filter layer is formed on the base substrate 6, opposite to the reflective area C and disposed on one side of the EML 3 away from the reflective layer 1, and the color filters of the sub-pixel units in each pixel unit have different colors. In this way, color display can also be realized.

Mode 2: as illustrated in FIG. 1, the EL device may also be in a bottom-emission structure. For instance, the reflective layer 1 is disposed on one side of the transparent cathode 2 away from the EML 3.

The reflective layer 1 is disposed on one side of the transparent cathode 2 away from the EML 3. In the case where a part of the EML 3 corresponding to the reflective area C emits light, the light emitted to the reflective layer 1 will be reflected by the reflective layer 1 to one side of the base substrate and emitted out of the EL device through the base substrate 6, and hence the bottom emission can be achieved.

On the basis of the mode 2, in order to achieve the color display of the EL device, as illustrated in FIGS. 1 and 5, in one embodiment, each pixel unit comprises three sub-pixel units. For instance, light emitted by EMLs 3 of the three sub-pixel units is red, green and blue respectively.

Of course, in another embodiment, each pixel unit may also include four sub-pixel units. For instance, light emitted by EMLs 3 of the sub-pixel units is red, green, blue and yellow respectively. As the light emitted by the EMLs 3 of the sub-pixel units in each pixel unit has different colors, the color display of the EL device can be achieved.

Figure 2:
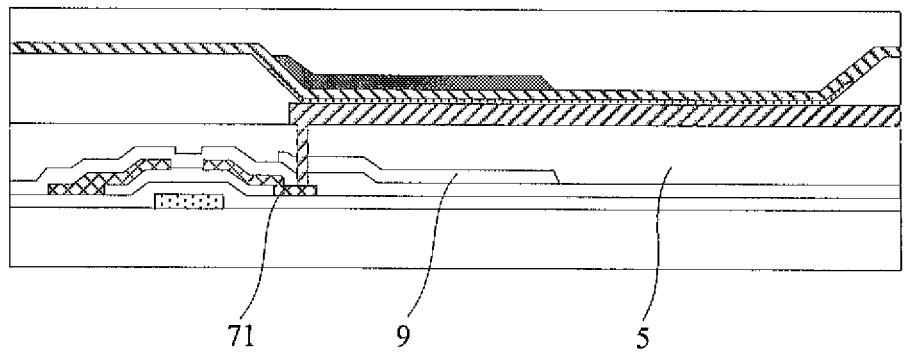
FIG. 2 is a schematic structural view of an EL device provided by an embodiment of the present invention, provided with color filters, in a bottom-emission structure.

As illustrated in FIG. 2, on the basis of the mode 2, in another preferred embodiment, the light emitted by the EMLs 3 of the plurality of sub-pixel units in each pixel unit of the EL device may be white; and one surface of the EML 3 away from the reflective layer 1 is provided with a color filter layer 9 opposite to the reflective area C and formed on the base substrate 6. The EL device may achieve color display with the color filters 9 of different colors in the sub-pixel units of each pixel unit. Moreover, as the transmissive areas A are not shielded by the color filters 9, the transparent effect of the transmissive area A in the case of transparent display can be improved.

When the light emitted by the EMLs 3 of the plurality of sub-pixel units in each pixel unit of the EL device is white, the color display can also be achieved with color filters, which are disposed on one side of the base substrate 6 away from the EMLs and are assembled with the base substrate 6 to form a cell.

With further reference to FIG. 1, preferably, in order to prevent water and oxygen from the outside from damaging the EL device, the EL device may further comprise an EML encapsulating structure 8. The EML encapsulating structure 8 is configured to encapsulate the EL device, so that the EL device can be isolated from the water and the oxygen from the outside, and hence the damages by the water and the oxygen to the EL device can be reduced. The encapsulating structure 8 is, for instance, made of an inorganic insulating material and may further have the function of a planarization layer.

With further reference to FIG. 1, the EL device are in an active matrix driving mode; a thin film transistor (TFT) 7 is further provided on the base substrate 6 and acts as a switching element; the transparent anode 4 is electrically connected with the source electrode 71 of the TFT 7; the gate electrode of the TFT 7 is electrically connected with the gate line of a corresponding pixel unit; and the drain electrode of the TFT 7 is electrically connected with the data line of corresponding pixel unit. Each pixel unit may be provided with more than one TFT which may act as the switching element and a drive element respectively.

For instance, a planarization layer 5 is disposed between the transparent anode 4 and the source electrode 71 of the TFT 7. The transparent anode 4 and the source electrode 71 are connected with each other via a through hole.

For instance, the TFT 7 may be an a-Si TFT, an LTPS TFT, an oxide semiconductor TFT or an organic TFT.

The embodiments of the present invention further provide a display device comprising the EL device provided by any of the foregoing embodiments. The display effect of the display device is good during transparent display.

The foregoing is only the preferred embodiments of the present invention and not intended to limit the scope of protection of the present invention. The scope of protection of the present invention should be defined by the appended claims.

The invention claimed is:

1. An electroluminescent (EL) device, comprising a base substrate, wherein
a plurality of pixel units arranged in an array are disposed on the base substrate; each pixel unit comprises sub-pixel units provided with EL structures;
the EL structure each comprises a transparent anode, an emission layer (EML) and a transparent cathode disposed on the base substrate in sequence;
the EL structure of each sub-pixel unit is divided into a transmissive area and a reflective area; and the reflective area of the EL structure is provided with a reflective layer;
the reflecive is disposed between the transparent anode and the EML;
a thin-film transistor (TFT) is further provided on the base substrate; and the transparent anode is in direct electrical contact with a source electrode of the TFT.

2. The EL device according to claim 1, wherein each pixel unit comprises three sub-pixel units, and EMLs of the three sub-pixel units emit red light, green light and blue light respectively.

3. The EL device according to claim 1, wherein light emitted by the EMLs of the plurality of sub-pixel units in each pixel unit is white; and one surface of the EML away from the reflective layer is provided with a color filter, which is opposite to the reflective area and is assembled with the base substrate to form a cell.

4. The EL device according to claim 1, further comprising an EML encapsulating structure.

5. The EL device according to claim 1, wherein the TFT is an amorphous silicon (a-Si) TFT, a low-temperate polycrystalline silicon (LTPS) TFT, an oxide semiconductor TFT or an organic TFT.

6. A display device, comprising the EL device according to claim 1.

* * * * *